United States Patent
Yi et al.

(10) Patent No.: US 6,647,310 B1
(45) Date of Patent: Nov. 11, 2003

(54) TEMPERATURE CONTROL OF AN INTEGRATED CIRCUIT

(75) Inventors: John Yi, Austin, TX (US); Fu-Weng Tea, Singapore (SG)

(73) Assignee: Advanced Micro Devices, Inc., Austin, TX (US)

( * ) Notice: Subject to any disclaimer, the term of this patent is extended or adjusted under 35 U.S.C. 154(b) by 702 days.

(21) Appl. No.: 09/580,098

(22) Filed: May 30, 2000

(51) Int. Cl.[7] .......................... G06F 19/00; H01L 23/34
(52) U.S. Cl. ...................... 700/121; 257/707; 428/213; 438/122
(58) Field of Search .............................. 700/95–97, 105, 700/108–110, 121, 155; 257/48, 467–470, 700, 706, 707, 720; 438/10, 11, 14–18, 54, 55, 122; 428/212–216; 361/704, 705, 709, 717–721

(56) References Cited

U.S. PATENT DOCUMENTS

| | | | | |
|---|---|---|---|---|
| 5,106,433 A | * | 4/1992 | Nakamura et al. .......... 148/546 |
| 5,440,172 A | * | 8/1995 | Sutrina ........................ 257/712 |
| 5,587,882 A | * | 12/1996 | Patel ............................ 361/705 |
| RE35,721 E | * | 2/1998 | Daikoku et al. ............. 165/185 |
| 5,729,431 A | * | 3/1998 | Marwah et al. ............. 361/687 |
| 5,847,436 A | * | 12/1998 | Iwata ........................... 257/467 |
| 5,972,737 A | * | 10/1999 | Polese et al. ................ 438/122 |
| 6,292,367 B1 | * | 9/2001 | Sikka et al. ................. 361/705 |
| 6,410,988 B1 | * | 6/2002 | Caletka et al. .............. 257/778 |
| 6,531,771 B1 | * | 3/2003 | Schoenstein et al. ....... 257/720 |
| 6,538,264 B2 | * | 3/2003 | Corbett et al. ................. 257/48 |

* cited by examiner

Primary Examiner—Maria N. Von Buhr
(74) Attorney, Agent, or Firm—Thomas L. Warden; Winstead Sechrest & Minick P.C.

(57) ABSTRACT

An apparatus and method for controlling temperature during pre-delivery testing of microprocessors and integrated circuits wherein a testing package, including a thermally conductive lid overlying and in thermal contact with the microprocessor or integrated circuit, is covered by a block of thermally conductive material of predetermined thickness T, where T is a function of a desired temperature profile and, optionally, the current drawn by the microprocessor undergoing testing.

20 Claims, 4 Drawing Sheets

TEMPERATURE CONTROL OF AN INTEGRATED CIRCUIT

TECHNICAL FIELD

The present invention relates in general to the field of temperature control, and more particularly, to temperature control of microprocessors and integrated circuits during pre-delivery testing.

BACKGROUND

Microprocessors, and other integrated circuits, typically undergo a series of tests prior to delivery to ensure that they operate within certain design specifications, for example, specifications for environmental operating conditions. During such tests, the microprocessor generates heat and increases in temperature.

In order to prevent destruction of the microprocessor during testing, its temperature must remain below a maximum specified operating temperature. On the other hand, the microprocessor must be allowed to increase in temperature during testing to approximate actual operating conditions and insure error free operation during actual use. Therefore, the temperature of a microprocessor undergoing pre-delivery testing must be controlled according to a desired temperature profile.

Pre-delivery testing of a microprocessor typically requires operation of the microprocessor in a testing package of a design that is known to those in the field of microprocessor testing and manufacturing. Moreover, in order to facilitate mass production, it is desirable to test several microprocessors at one time by operating each in its own testing package under controlled environmental conditions in a parallel testing configuration.

Typically, such a known testing package comprises a socket for receiving the microprocessor, the socket also providing electrical connections to enable operation of the microprocessor by a given set of testing instructions passed to the microprocessor by testing software. Such a socket receives the microprocessor, which is then covered by a lid, the lid closes such that it secures the microprocessor within the socket. A thermocouple is typically provided on the lid, adjacent to the microprocessor, to enable sensing of the temperature of the microprocessor.

The testing package comprising the socket, microprocessor, lid, and thermocouple is then covered with a heat sink, which is placed in thermal contact with the lid and the underlying microprocessor. The heat sink most often includes exterior fins that facilitate convective heat transfer between the heat sink and the surrounding atmosphere, where heat transfer is aided by a controllable fan mounted in close proximity to the heat sink.

Temperature of the microprocessor is controlled in these prior testing packages by utilizing an active feedback system whereby the temperature of the microprocessor is monitored and controlled during testing. If the thermocouple of the testing package senses a temperature greater than the desired testing specification, an active feedback loop activates the controllable fan placed near the heat sink to effect cooling.

These prior systems for controlling the temperature of microprocessors undergoing pre-delivery testing tend to be relatively complex and costly. For each microprocessor being tested, these prior temperature control systems require a separate feedback loop including a thermocouple, a fan, a heat sink, and a corresponding logic circuit to provide active feedback loop control. Periodically, sensitive components of these systems must be calibrated, repaired, or replaced.

In these prior active feedback temperature control systems, delays or interruptions resulting from complex equipment set-up procedures, calibration, and repairs often diminish productivity and increase manufacturing costs, particularly when numerous microprocessors are tested in parallel.

Accordingly, it would be desirable to provide a simple and durable alternative to the present active feedback temperature control apparatus and methods that would allow efficient and low cost, parallel testing of numerous microprocessor or integrated circuits.

SUMMARY OF THE INVENTION

The present invention provides an apparatus and method for controlling the temperature of microprocessors during pre-delivery testing whereby a testing package, including a thermally conductive lid overlying and in thermal contact with the microprocessor, is covered by a block of thermally conductive material of predetermined thickness T, where T is a function of a desired temperature profile and, optionally, the current drawn by the microprocessor undergoing testing.

By selecting the thickness T of the block of thermally conductive material so that a desired microprocessor temperature profile maybe achieved, the present invention does not require active feedback temperature control, and thus does not require the complex, failure prone, or expensive equipment normally used in active feedback microprocessor testing procedures.

Because blocks of thermally conductive material are easily and inexpensively manufactured and configured for use in controlling temperature according to the present invention, large numbers of microprocessors may be tested in parallel at relatively low cost. In addition, because the blocks of thermally conductive material lack any moving parts or electrical connections, and are thus not prone to failure, large numbers of microprocessors may be tested without delays that might otherwise result from calibrating, repairing, or replacing components.

The foregoing has outlined the features and technical advantages of the present invention in order that the detailed description of the invention that follows may be better understood.

Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following description, taken in conjunction with the accompanying drawings, in which.

DETAILED DESCRIPTION

Figure 1:
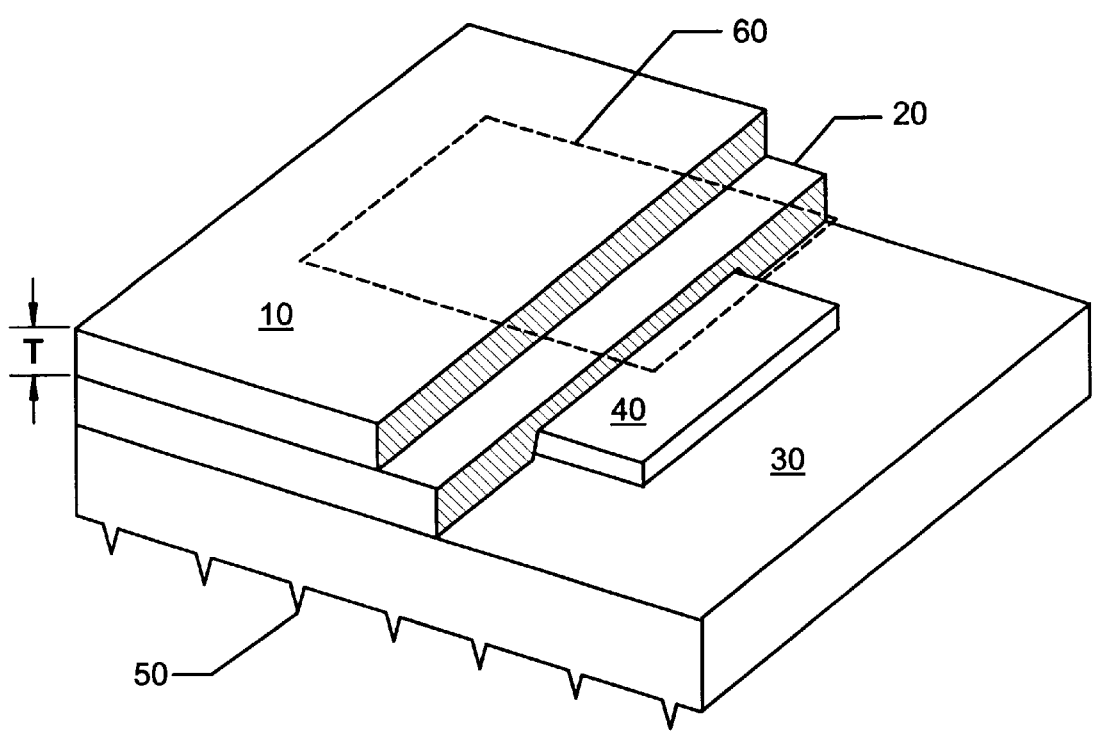
FIG. 1 is a perspective cutaway view of an embodiment of the present invention.

Refer now to the drawings, wherein the depicted elements are not necessarily shown to scale and wherein like or similar elements are designated by the same reference numeral through the several views.

The present invention is described below in the context of temperature control during pre-delivery testing of microprocessors. However, it should be understood by those skilled in the art to which the present invention pertains that the apparatus and methods herein described are also generally applicable to any short duration temperature control of microprocessors, as well as other integrated circuits, wherein the starting temperature maximum desired operating temperature, and testing duration may be ascertained prior to testing.

FIG. 1 is a perspective cut away view of an apparatus configured in accordance with the present invention, which comprises a socket 30 with electrical connectors 50 for receiving a microprocessor 40, a lid 20 of thermally conductive material overlying and in thermal contact with microprocessor 40, and a block 10 of thermally conductive material of thickness T overlying and in thermal contact with lid 20. Bonding of the various parts together is performed using well-known techniques.

In FIG. 1, lid 20 is shown cutaway to reveal microprocessor 40. However, it should be understood that lid 20 extends to substantially cover microprocessor 40. Similarly, block 10 is shown cutaway to reveal lid 20 and microprocessor 40. However, it should be further understood that block 10 extends to substantially cover lid 20, at least in the area 60 directly above microprocessor 40 (shown by hidden lines). Optionally, lid 20 and block 10 may each be formed, as otherwise indicated herein, so as to cover substantially the whole surface of socket 30.

Socket 30 is a generally known microprocessor testing socket that secures microprocessor 40 during pre-delivery testing and provides electrical connectors 50 for passing testing instructions to microprocessor 40. Prior to testing, microprocessor 40 is secured in socket 30 and electrical connections are established between a testing software code source of the type known in the relevant art (not shown), through connectors 50, and to microprocessor 40, such that a testing instruction set may be passed to microprocessor 40 during pre-delivery testing.

It is known that microprocessors generate heat both during pre-delivery testing and during normal operation. In the present invention, lid 20 and block 10 are each formed from a thermally conductive material, such as aluminum, such that heat may transfer by conduction from microprocessor 40 through lid 20, and to block 10, where heat is then transferred into the environment through convection and radiation.

Block 10 is shown in FIG. 1 as having a constant thickness T, which forms a determinable volume and mass of the thermally conductive material. However, by reference to this description, it should be understood by those skilled in the art of microprocessor manufacturing and testing that block 10 may be formed in many different shapes creating such a volume and mass, so long as block 10 provides an area of thermal contact with lid 20. In fact, block 10 and lid 20 could both be combined as a single component.

Heat generated by microprocessor 40 during pre-delivery testing is largely a function of the electric current drawn by microprocessor 40, which itself depends largely upon the instruction set being passed to microprocessor 40 by the particular testing software.

Prior to testing any specific microprocessor 40, certain initial conditions are known or readily ascertained. These initial conditions include: (a) the current drawn by microprocessor 40; (b) the time required to complete testing of microprocessor 40; (c) the maximum desired temperature ($T_{max}$) of the microprocessor 40; and (d) the initial temperature ($T_0$) of the testing environment and microprocessor 40.

Therefore, using the heat transfer relationship provided by the present invention, as discussed above, empirical studies have revealed that a desirable, steadily increasing temperature profile of microprocessor 40 can be achieved by selecting block 10 of a thickness T, which depends upon these initial conditions. For any given lot of microprocessors undergoing simultaneous pre-delivery testing, the initial temperature ($T_0$) of the testing environment and microprocessor 40, and the current drawn by microprocessor 40 are the only initial conditions that typically differ between testing lots.

The maximum desired temperature ($T_{max}$) of the microprocessor 40 typically remains fixed according to design or testing specifications for the specific model of microprocessor 40. In addition, the current drawn by microprocessor 40 is typically well known when a specific model of microprocessor 40 is subject to pre-delivery testing in a common testing environment, namely, a common power supply, common socket 30, and common testing software.

Therefore, based upon empirical testing under simulated conditions, a single block 10 of thickness T may be easily selected for any given microprocessor 40 undergoing testing in a common testing environment according to the initial temperature ($T_0$) of the testing environment and microprocessor 40, and optionally, according to the actual current drawn by microprocessor 40.

Therefore, whenever relatively minor temperature deviations in microprocessor 40 are acceptable, thickness T of block 10 maybe selected based only upon the initial temperature ($T_0$) of the testing environment and microprocessor 40.

Figure 2:
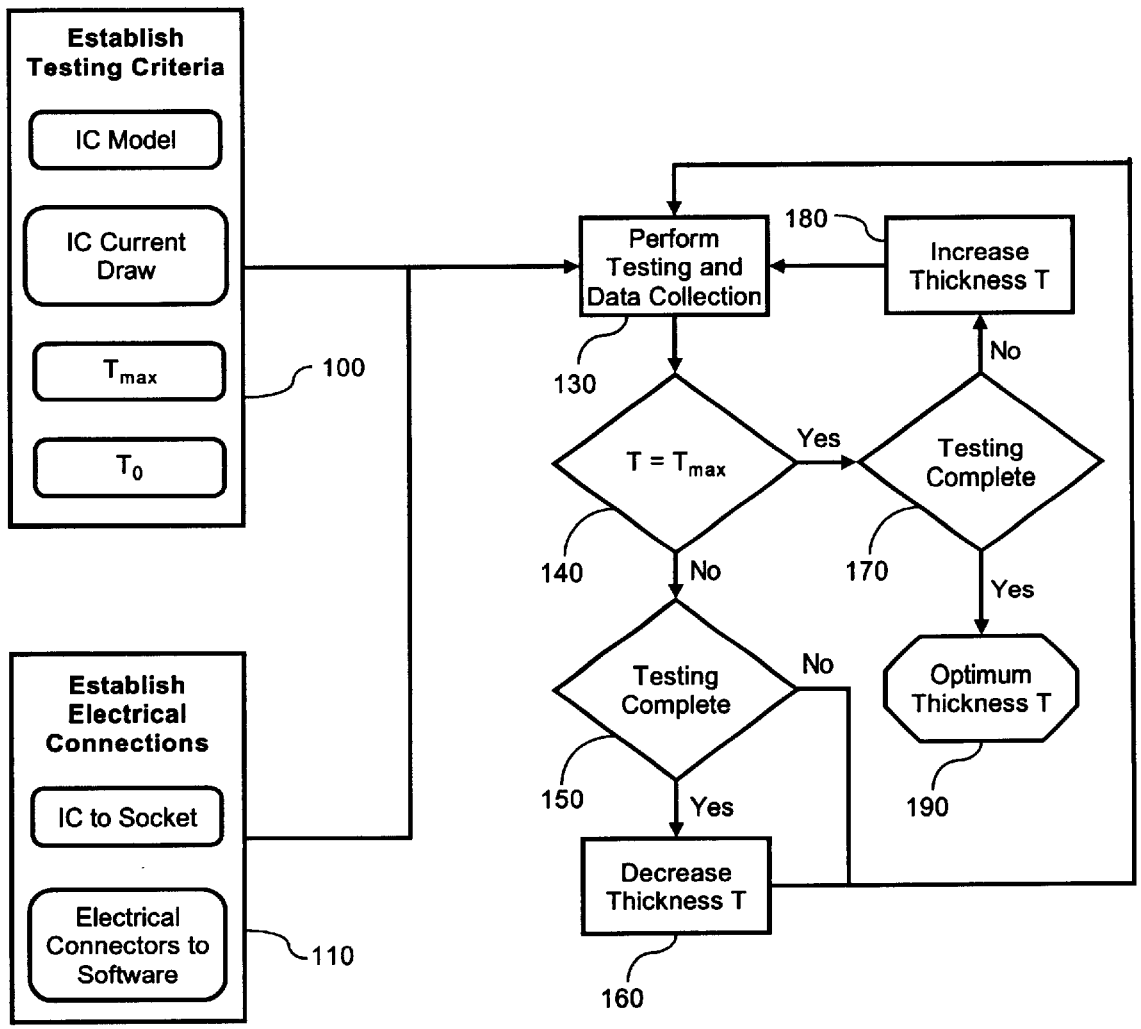
FIG. 2 is a flowchart diagram of a process of the present invention.

Referring to FIG. 2, there is shown a flow diagram of a process of the present invention to select an appropriate thickness T of block 10 corresponding to particular initial conditions, including initial temperature ($T_0$), in order to provide a desirable, steadily increasing temperature profile of a particular microprocessor 40 during pre-delivery testing steps 100 and 110 of FIG. 2, establishing testing criteria and establishing electrical connections, respectively, provide the basic initial criteria for empirically determining the appropriate thickness T of block 10 (as illustrated in FIG. 1). Prior to the start of testing, electrical connections are established between microprocessor 40 and socket 30, as well as between electrical connectors 50 and the testing software code source (not shown), as is illustrated by reference to step 110 of FIG. 2 in view of the cited elements shown in FIG. 1. In step 100, initial conditions are ascertained which include: (a) the model designation of the particular microprocessor or integrated circuit ("IC"); (b) the current drawn by the particular microprocessor or integrated circuit ("IC"); (c) the initial temperature ($T_0$) of the testing environment and microprocessor; and (d) the maximum desired temperature ($T_{max}$) of the microprocessor. Electrical current and temperature may be measured, and corresponding data collected, by using any one of many instruments or methods otherwise known by those skilled in the relevant art to be useful for this purpose.

Once steps 100 and 110 are complete, testing is commenced and time and microprocessor temperature data are collected, as is shown in step 130. As testing progresses, microprocessor temperature is compared to the maximum desired temperature ($T_{max}$), as shown in step 140 of FIG. 2. So long as the temperature of the microprocessor being tested remains below the maximum desired temperature ($T_{max}$), testing continues until complete, as is shown in step 150. If the microprocessor temperature fails to reach the approximate maximum desired temperature ($T_{max}$) upon completion of testing, thickness T of block 10 (shown in FIG. 1) should be decreased, as is shown in step 180 of FIG. 2. On the other hand, if the microprocessor temperature exceeds the maximum desired temperature ($T_{max}$) prior to completion of testing, thickness T of block 10 (shown in FIG. 1) should be increased, as is illustrated in steps 170 and 180 of FIG. 2.

Steps 130 through 180 are iteratively repeated, each iteration using an increased or decreased thickness T of block 10 (shown in FIG. 1) until, according to the method of the present invention, a thickness T of block 10 is empirically derived that permits completion of microprocessor testing at a time when the microprocessor temperature is approximately equal to the maximum desired temperature ($T_{max}$), as is shown in step 190 of FIG. 2.

By repeating the method of the present invention for selecting thickness T of block 10 (shown in FIG. 1) over a broad range of potential initial temperatures ($T_0$) and, optionally, over a broad range of potential microprocessor currents, and recording the resulting microprocessor temperature profiles achieved, an appropriate thickness T of block 10 (shown in FIG. 1) may be selected for actual testing conditions based upon these empirical results.

By way of example, two tests were performed using the apparatus and methods of the present invention. Referring now to FIG. 1, in each test, thickness T of block 10 was derived empirically based on the current drawn by microprocessor 40, the initial temperature ($T_0$) of microprocessor 40, and the desired maximum temperature ($T_{max}$) of microprocessor 40. In both tests, the present invention provided an apparatus and method for controlling the temperature of a microprocessor undergoing pre-delivery testing.

Both tests used a standard testing package of the type known to those of ordinary skill in the field of microprocessor testing, and were conducted using a standard 350 MHz K6 series microprocessor manufactured by Advanced Micro Devices. Power was supplied to this particular microprocessor in each test at 2.1 volts. A thermocouple was placed near the microprocessor to measure its approximate operating temperature during testing. The microprocessors were tested using a standard instruction set for testing operability of K6 series microprocessors.

Three roughly rectangular aluminum blocks, as illustrated by block 10 in FIG. 1, were machined to match the approximate size of lid 20. The three aluminum blocks were machined to a thickness T of 3, 6.3, and 7 mm, respectively.

Temperature data were collected during microprocessor testing at 30 second intervals, from time zero until a desired maximum temperature ($T_{max}$) was attained. Nine data series were collected using the three aluminum blocks, each at typical initial temperatures ($T_0$) of approximately 25, 35, and 45 degrees C.

Test Number 1

For test number 1, the 2.1 volt microprocessor power supply produced a measured current of 26.63 mA/MHz. The maximum desired temperature ($T_{max}$) selected for test number 1 was 75.0 degrees C. Temperature data (in degrees C) from test number 1 is displayed in the chart below and in the graph of FIG. 3.

|        | Test Time (minutes) |      |      |      |      |      |      |      |      |      |      |
|--------|------|------|------|------|------|------|------|------|------|------|------|
| T (mm) | 0    | 0.5  | 1    | 1.5  | 2    | 2.5  | 3    | 3.5  | 4    | 4.5  | 5    |
| 3      | 27.5 | 40.3 | 48.6 | 54.5 | 61.2 | 66.7 | 71.7 |      |      |      |      |
| 3      | 36.0 | 47.1 | 55.8 | 62.2 | 68.2 | 73.0 |      |      |      |      |      |
| 3      | 43.1 | 54.9 | 63.4 | 69.3 | 73.5 |      |      |      |      |      |      |
| 6.3    | 26.2 | 33.9 | 39.8 | 46.4 | 52.8 | 56.4 | 61.5 | 65.5 | 70.1 |      |      |
| 6.3    | 36.6 | 47.0 | 53.7 | 59.3 | 63.9 | 68.6 | 72.4 | 77.0 |      |      |      |
| 6.3    | 45.4 | 55.5 | 61.0 | 66.7 | 71.5 |      |      |      |      |      |      |
| 7      | 23.0 | 35.4 | 40.2 | 43.4 | 48.1 | 52.3 | 55.8 | 59.7 | 63.6 | 67.1 | 70.0 |
| 7      | 37.3 | 48.5 | 54.7 | 58.3 | 62.0 | 65.6 | 68.5 | 72.0 | 75.6 |      |      |
| 7      | 43.7 | 52.7 | 58.9 | 62.0 | 66.0 | 69.3 | 72.4 | 76.9 |      |      |      |

Figure 3:
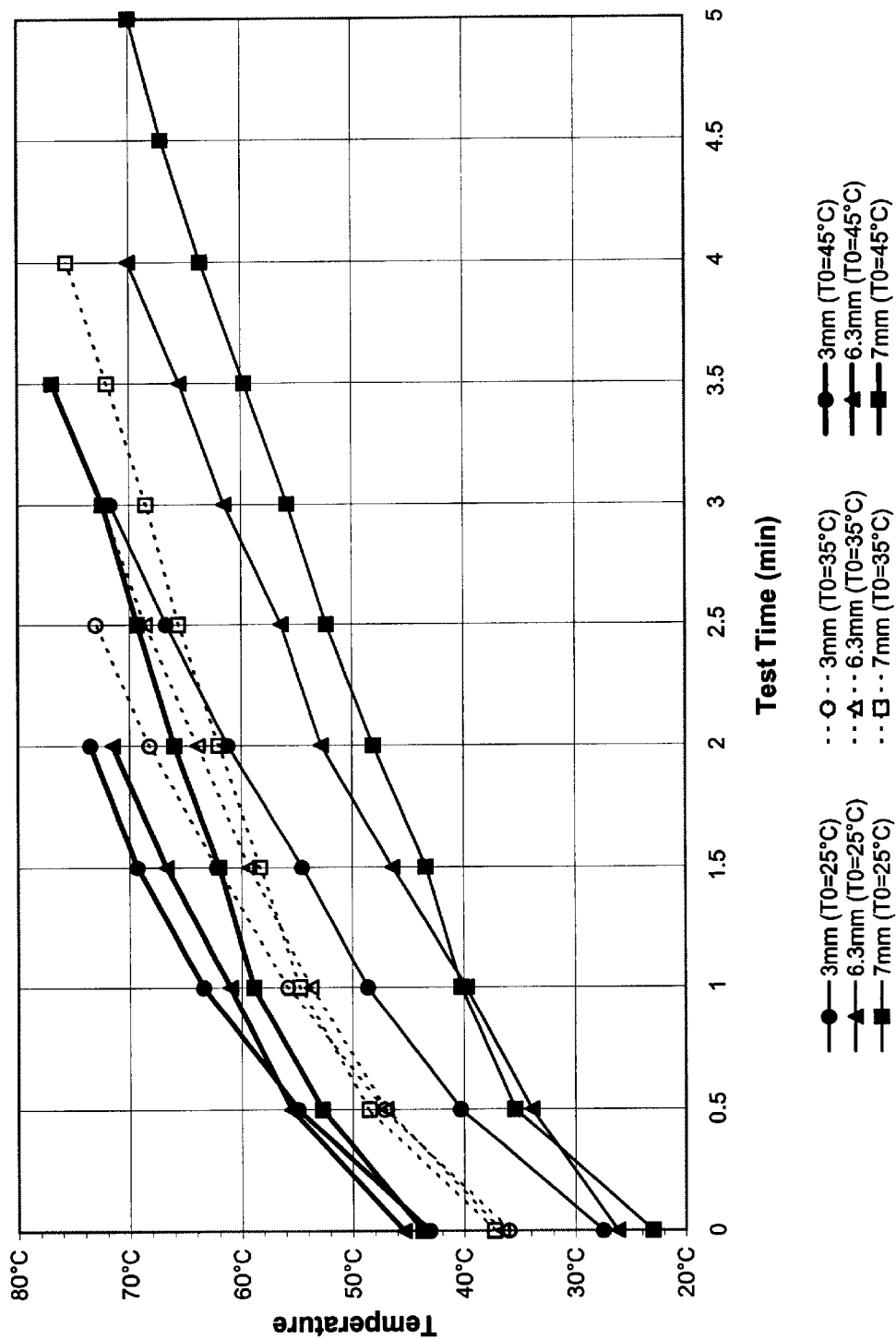
FIG. 3 is a graph of the temperature of a microprocessor undergoing testing using a method of temperature control provided by the present invention, as further described by reference to test number 1 below.

As can be seen from a review of the chart above and from FIG. 3, a block of thickness T can be chosen to provide a desirable microprocessor temperature profile for testing purposes. For example, using the test data and apparatus specified above, if the particular testing instruction set requires 3.5 minutes of microprocessor operation and the initial temperature ($T_0$) is 35 degrees C., then for the corresponding maximum desired temperature ($T_{max}$) of 75 degrees C., an aluminum block of thickness T equal to 7 mm would provide a desirable, steadily increasing temperature profile.

Test Number 2

For test number 2, the 2.1 volt microprocessor power supply produced a measured current of 25.31 mA/MHz. The maximum desired temperature ($T_{max}$) selected for test number 2 was 85.0 degrees C. Temperature data (in degrees C) from test number 2 is displayed in the chart below and in the graph of FIG. 4.

|  | Test Time (minutes) | | | | | | | | | | |
|---|---|---|---|---|---|---|---|---|---|---|---|
| T (mm) | 0 | 0.5 | 1 | 1.5 | 2 | 2.5 | 3 | 3.5 | 4 | 4.5 | 5 |
| 3 | 26.8 | 38.5 | 47.5 | 53.8 | 60.1 | 66.5 | 71.4 | 76.2 | 81.4 | 85.5 | |
| 3 | 36.1 | 47.5 | 56.0 | 62.3 | 68.5 | 74.0 | 78.9 | 83.5 | 88.0 | 92.1 | |
| 3 | 46.6 | 55.8 | 63.5 | 69.5 | 74.9 | 79.8 | 83.9 | 89.0 | | | |
| 6.3 | 27.8 | 38.4 | 44.2 | 50.7 | 56.5 | 61.2 | 66.0 | 70.9 | 75.5 | 79.1 | 82.6 |
| 6.3 | 35.5 | 46.8 | 53.0 | 59.0 | 64.0 | 68.8 | 73.0 | 77.6 | 81.7 | 85.2 | 85.5 |
| 6.3 | 46.7 | 55.8 | 61.0 | 66.2 | 71.0 | 75.1 | 79.2 | 83.3 | 86.9 | | |
| 7 | 27.3 | 38.1 | 45.9 | 48.4 | 54.2 | 57.6 | 62.2 | 65.6 | 69.5 | 73.0 | 76.0 |
| 7 | 37.5 | 47.5 | 52.6 | 56.5 | 60.8 | 65.0 | 68.4 | 71.8 | 75.2 | 79.1 | 81.4 |
| 7 | 45.0 | 55.3 | 61.6 | 65.2 | 69.4 | 73.0 | 76.0 | 79.5 | 83.9 | 86.2 | |

Figure 4:
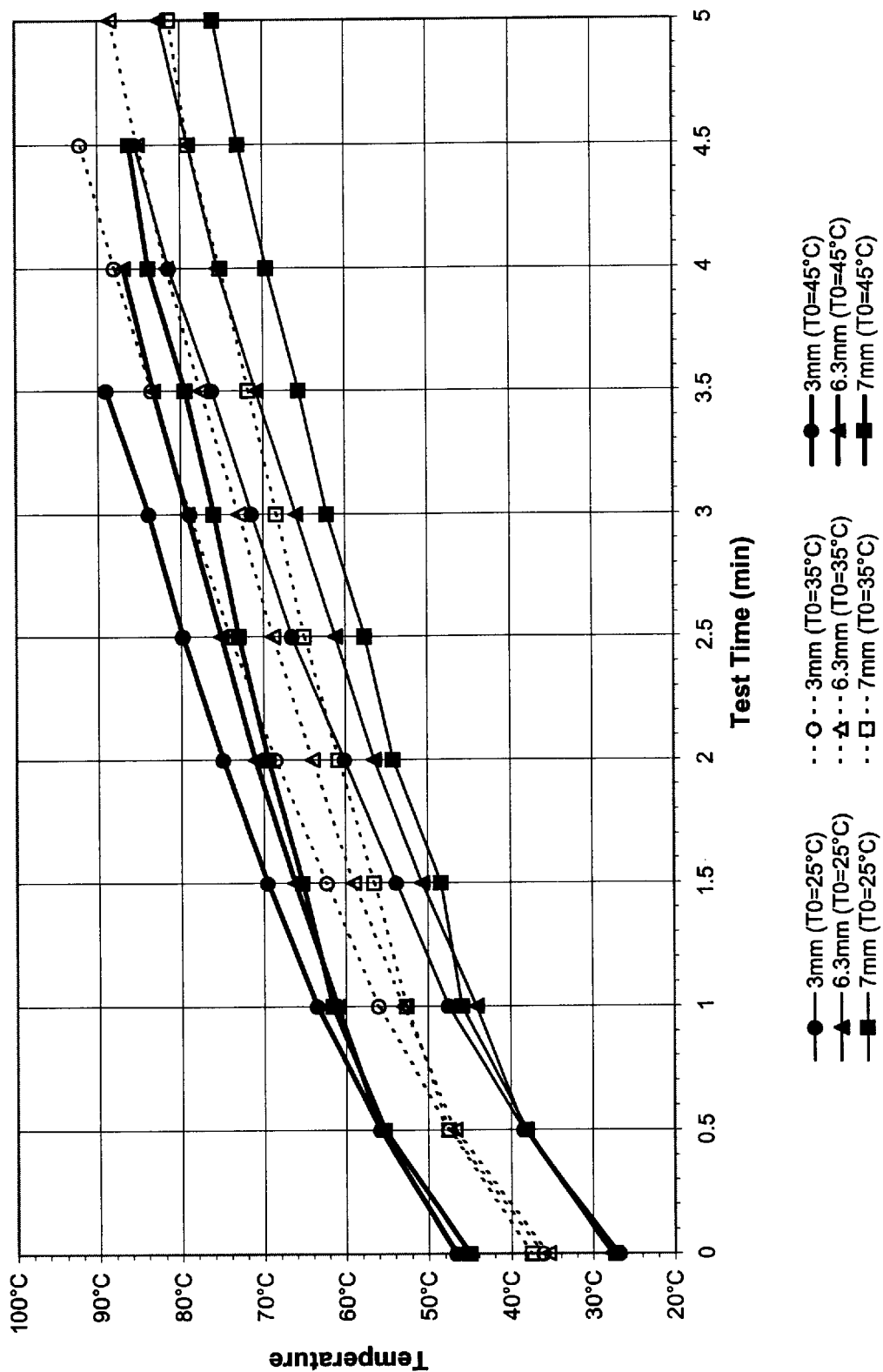
FIG. 4 is a graph of the temperature of a microprocessor undergoing testing using a method of temperature control provided by the present invention, as further described by reference to test number 2 below.

As can be seen from are view of the chart above and from FIG. 4, a block of thickness T can be chosen to provide a desirable microprocessor temperature profile for testing purposes. For example, using the test data and apparatus specified above, if the particular testing instruction set requires 4.5 minutes of microprocessor operation and the initial temperature ($T_0$) is 35 degrees C., then for the corresponding maximum desired temperature ($T_{max}$) of 85 degrees C., an aluminum block of thickness T equal to 6.3 mm would provide a desirable, steadily increasing temperature profile.

Accordingly, the present invention provides an apparatus and method for controlling temperature during pre-delivery testing of microprocessors where by a testing package, including a thermally conductive lid overlying and in thermal contact with the microprocessor, is covered by a block of thermally conductive material of predetermined thickness T, where T is a function of a desired temperature profile and, optionally, the current drawn by the microprocessor undergoing testing.

Although the present invention and its advantages have been described in detail, it should be understood that various changes, substitutions, and alterations can be made herein without departing from the spirit and scope of the invention as defined by the appended claims.

What is claimed is:

1. An apparatus for temperature control of an integrated circuit comprising:

a socket for receiving the integrated circuit and passing a set of instructions to the integrated circuit; and a thermally conductive block of thickness T overlying and in thermal contract with the integrated circuit, where thickness T is a function of a desired temperature profile of the integrated circuit, such that heat may transfer from the integrated circuit to the thermally conductive block in order to provide a desirable temperature profile of the integrated circuit.

2. The apparatus of claim 1, wherein the thermally conductive block substantially covers the integrated circuit.

3. The apparatus claim 1, wherein thickness T is a function of an electric current drawn by the integrated circuit.

4. The apparatus of claim 1, wherein the thermally conductive block substantially covers the integrated circuit and thickness T is a function of an electric current drawn by the integrated circuit.

5. The apparatus of claim 1, wherein the desired temperature profile of the integrated circuit is a function of an increase in a temperature of the integrated circuit over a specified time period.

6. An apparatus for temperature control of an integrated circuit undergoing pre-delivery testing, comprising:

a testing package for receiving the integrated circuit and passing a set of testing instructions to the integrated circuit, the testing package including a thermally conductive lid overlying and in thermal contact with the integrated circuit; and a thermally conductive block of thickness T overlying and in thermal contact with the thermally conductive lid, where thickness T is a function of a desired temperature profile of the integrated circuit.

7. The apparatus of claim 6, wherein the thermally conductive lid substantially covers the integrated circuit, and the thermally conductive block substantially covers the thermally conductive lid over an area at least above the integrated circuit.

8. The apparatus claim 6, wherein thickness T is a function of an electric current drawn by the integrated circuit.

9. The apparatus of claim 6, wherein the thermally conductive block substantially covers the integrated circuit and thickness T is a function of an electric current drawn by the integrated circuit.

10. The apparatus of claim 6, wherein the desired temperature profile of the integrated circuit is a function of an increase in a temperature of the integrated circuit over a specified time period.

11. A method for controlling the temperature of an integrated circuit, said method comprising the steps of:

placing the integrated circuit in a socket;

selecting a thermally conductive block of thickness T, where thickness T is a function of a desired temperature profile of the integrated circuit;

placing the thermally conductive block in thermal contact with the integrated circuit; and passing a set of testing instructions to the integrated circuit such that a temperature of the integrated circuit substantially conforms to a desired temperature profile.

12. The method of claim 11, further including the step of substantially covering the integrated circuit with the thermally conductive block.

13. The method claim 11, wherein thickness T is a function of an electric current drawn by the integrated circuit.

14. The method of claim 11, wherein thickness T is a function of an electric current drawn by the integrated circuit, and further including the step of substantially covering the integrated circuit with the thermally conductive block.

15. The method of claim 11, wherein the desired temperature profile of the integrated circuit is a function of an increase in a temperature of the integrated circuit over a specified time period.

16. A method for controlling the temperature of an integrated circuit undergoing pre-delivery testing, said method comprising the steps of:

placing the integrated circuit in a testing package, the testing package including a thermally conductive lid, placing the thermally conductive lid in thermal contact with the integrated circuit;

selecting a thermally conductive block of thickness T, where thickness T is a function an initial temperature of the integrated circuit;

placing the thermally conductive block in thermal contact with the thermally conductive lid; and passing a set of testing instructions to the integrated circuit such that a temperature of the integrated circuit during testing substantially conforms to a desired testing temperature profile.

17. The method of claim 16, further including the steps of:

substantially covering the integrated circuit with the thermally conductive lid, and substantially covering the thermally conductive lid with the thermally conductive block in at least an area above the integrated circuit.

18. The method claim 16, wherein thickness T is a function of an electric current drawn by the integrated circuit.

19. The method of claim 16, wherein thickness T is a function of an electric current drawn by the integrated circuit, and further including the steps of:

substantially covering the integrated circuit with the thermally conductive lid; and substantially covering the thermally conductive lid with the thermally conductive block in at least an area above the integrated circuit.

20. The method of claim 16, wherein the desired temperature profile of the integrated circuit is a function of an increase in a temperature of the integrated circuit over a specified time period.

* * * * *

UNITED STATES PATENT AND TRADEMARK OFFICE
CERTIFICATE OF CORRECTION

PATENT NO. : 6,647,310 B1
DATED : November 11, 2003
INVENTOR(S) : John Yi and Fu-Weng Tea It is certified that error appears in the above-identified patent and that said Letters Patent is hereby corrected as shown below:

Column 7,
Line 60, following "circuit" please insert -- , --.

Column 8,
Line 36, following "circuit" please insert -- , --.

Column 9,
Lines 7 and 21, please replace "," with -- ; --.

Signed and Sealed this

Sixth Day of July, 2004

JON W. DUDAS
*Acting Director of the United States Patent and Trademark Office*